United States Patent
Fujita et al.

(10) Patent No.: US 10,593,633 B2
(45) Date of Patent: Mar. 17, 2020

(54) SEMICONDUCTOR MODULE

(71) Applicant: Mitsubishi Electric Corporation, Tokyo (JP)

(72) Inventors: Shigeto Fujita, Tokyo (JP); Tetsuya Matsuda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/308,551

(22) PCT Filed: Sep. 13, 2016

(86) PCT No.: PCT/JP2016/076894
§ 371 (c)(1),
(2) Date: Dec. 10, 2018

(87) PCT Pub. No.: WO2018/051389
PCT Pub. Date: Mar. 22, 2018

(65) Prior Publication Data
US 2019/0198459 A1 Jun. 27, 2019

(51) Int. Cl.
*H01L 23/60* (2006.01)
*H01L 25/07* (2006.01)
(Continued)

(52) U.S. Cl.
CPC ............ *H01L 23/60* (2013.01); *H01L 23/051* (2013.01); *H01L 23/48* (2013.01); *H01L 24/72* (2013.01);
(Continued)

(58) Field of Classification Search
CPC ........ H01L 24/71; H01L 24/72; H01L 23/481; H01L 23/60; H01L 23/62
See application file for complete search history.

(56) References Cited

U.S. PATENT DOCUMENTS 5,705,853 A 1/1998 Faller et al.
2004/0207070 A1 10/2004 Kaufmann et al.
(Continued)

FOREIGN PATENT DOCUMENTS

EP 1475832 A1 11/2004
JP S54-86348 * 6/1979 ............... H01H 1/38
(Continued)

OTHER PUBLICATIONS

Written Opinion of the International Searching Authority, WIPO, dated Dec. 2018, all pages. (Year: 2018).*
(Continued)

*Primary Examiner* — Victoria K. Hall
(74) *Attorney, Agent, or Firm* — Studebaker & Brackett PC (57) ABSTRACT

It is an object of the present invention to provide a semiconductor module which suppresses a break in a current path and occurrence of arc discharge when a semiconductor chip is short-circuited. A semiconductor module 100 according to the present invention includes at least one semiconductor chip 2, a housing 5 in which the semiconductor chip 2 is stored, and at least one pressurizing member which is placed between an upper electrode 2a of the semiconductor chip 2 and an upper-side electrode 3 provided in the housing 5 and electrically connects the upper electrode 2a and the upper-side electrode 3, the pressurizing member 10 is elastic, and the pressurizing member 10 includes a conductive block 12 and a plate spring member 11 including current paths 11a and 11b which are opposed to each other with at least a part of the conductive block 12 located between the current paths 11a and 11b.

14 Claims, 10 Drawing Sheets

(51) Int. Cl.
  *H01L 23/051* (2006.01)
  *H01L 23/00* (2006.01)
  *H01L 25/18* (2006.01)
  *H01L 23/48* (2006.01)

(52) U.S. Cl.
  CPC ............ *H01L 25/07* (2013.01); *H01L 25/072* (2013.01); *H01L 25/18* (2013.01); *H01L 2924/13055* (2013.01); *H01L 2924/13091* (2013.01)

(56) References Cited

U.S. PATENT DOCUMENTS

| | | | |
|---|---|---|---|
| 2013/0043578 A1* | 2/2013 | Dugal | H01L 23/62 257/690 |
| 2014/0375244 A1* | 12/2014 | Iwamizu | H02P 8/36 318/696 |
| 2015/0115423 A1* | 4/2015 | Yamashita | H01L 23/49575 257/675 |

FOREIGN PATENT DOCUMENTS

| | | |
|---|---|---|
| JP | S63-211526 A | 9/1988 |
| JP | H09-107068 A | 4/1997 |
| JP | 2004-528724 A | 9/2004 |
| JP | 2009-043775 A | 2/2009 |
| JP | 2013-027260 A | 2/2013 |
| JP | 2013-048239 A | 3/2013 |

OTHER PUBLICATIONS

International Search Report issued in PCT /JP2016/076894; dated Nov. 8, 2016.

An Office Action mailed by the Japanese Patent Office dated Oct. 1, 2019, which corresponds to Japanese Patent Application No. 2018-538971 and is related to U.S. Appl. No. 16/308,551.

* cited by examiner

FIG. 10
RELATED ART

SEMICONDUCTOR MODULE

TECHNICAL FIELD

The present invention relates to a semiconductor module.

BACKGROUND ART

Known is a semiconductor module in which a plurality of semiconductor chips are placed in a housing and pressures are uniformly applied to the semiconductor chips by elasticity while each of the semiconductor chips is kept electrically connected to an electrode (refer to Patent Document 1, for example). In a case where such a semiconductor module as described is used for power control or the like, each of semiconductor chips should control ON/OFF of a large current. In order to increase a current-carrying capacity, a plurality of current paths are provided for a single semiconductor chip.

PRIOR ART DOCUMENTS

Patent Documents

Patent Document 1: Japanese Translation of PCT International Application Publication No. 2004-528724

SUMMARY

Problem to be Solved by the Invention

When a semiconductor chip is short-circuited due to malfunction or the like, currents which are larger than those flowing under normal operating conditions flow in the same direction through a plurality of current paths. Then, an electromagnetic force is generated between the current paths, so that a part forming the current paths may be damaged and a break in the current paths may occur. Due to a break in the current paths, arc discharge may occur in a housing of a semiconductor module.

Hence, there is a need to design a housing of a semiconductor module with consideration given to resistance to arc discharge, on the assumption that arc discharge occurs. Thus, a size and a weight of a housing are increased, which causes problems of an increased size and an increased weight of a semiconductor module, and of an increased manufacturing cost.

The present invention has been made in order to solve the above-described problems, and it is an object of the present invention to provide a semiconductor module which suppresses a break in a current path and occurrence of arc discharge when a semiconductor chip is short-circuited.

Means to Solve the Problem

A semiconductor module according to the present invention includes: at least one semiconductor chip; a housing in which the semiconductor chip is stored; and at least one pressurizing member that is placed between an upper electrode of the semiconductor chip and an upper-side electrode provided in the housing and is configured to electrically connect the upper electrode and the upper-side electrode, wherein the pressurizing member is elastic, and the pressurizing member includes: a conductive block; and a plate spring member including current paths that are opposed to each other with at least a part of the conductive block located between the current paths.

Effects of the Invention

In the semiconductor module according to the present invention, the conductive block is placed between the opposed current paths of the plate spring member, so that a current flowing in a direction opposite to a short-circuit current is produced in the conductive block when a short-circuit current flows through the current paths. Accordingly, a force of attraction generated between the opposed current paths is relieved. Hence, disconnection of the current paths due to damage to the plate spring member is suppressed, so that occurrence of arc discharge in the housing of the semiconductor module is suppressed. Consequently, strength which is required of the housing of the semiconductor module is reduced, so that increase of a size and a weight of the semiconductor module and increase of a manufacturing cost can be suppressed.

The object, features, aspects and advantages of the present invention will be more apparent from the following detailed description of the present invention in conjunction with the accompanying drawings.

DESCRIPTION OF EMBODIMENTS

<Basic Technique>

Figure 10:
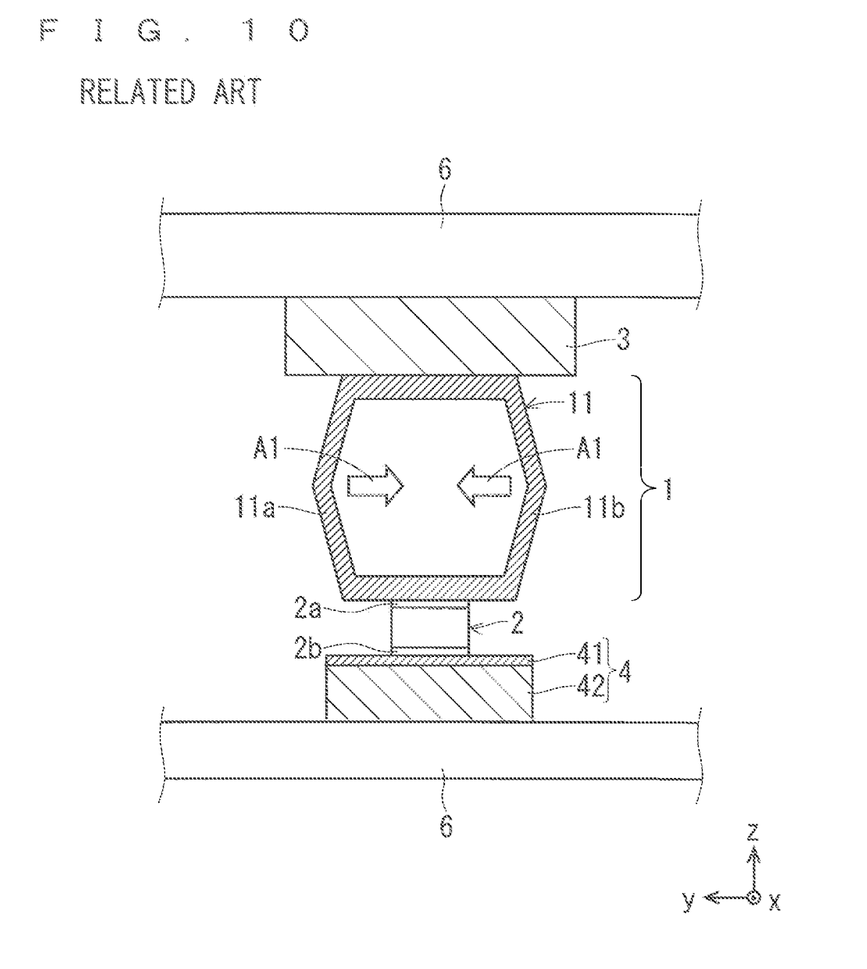
FIG. 10 is a side view of an inside of a housing of a semiconductor module according to a basic technique.

Before describing embodiments of the present invention, a technique on which the present invention is based will be described. FIG. 10 is a side view of an inside of a housing of a semiconductor module according to a basic technique. As shown in FIG. 10, the semiconductor module according to the basic technique includes a semiconductor chip 2, a housing 6, and a pressurizing member 1. The semiconductor chip 2 and the pressurizing member 1 are stored in the housing 6.

It is noted that the semiconductor chip 2 is a power semiconductor chip such as an insulated gate bipolar transistor (IGBT), for example. The semiconductor chip 2 includes an upper electrode 2a which serves as main electrode and is placed in an upper surface of the semiconductor chip 2, and a lower electrode 2b which serves as a main electrode and is placed in a lower surface of the semiconductor chip 2. Also, in a case where the semiconductor chip 2 is a switching element, the semiconductor chip 2 further includes a control electrode not shown in the drawings. The semiconductor chip 2 is mounted onto a substrate 4 in which a circuit pattern 41 is formed in a surface of an insulating substrate 42. The lower electrode 2b of the semiconductor chip 2 is joined to the circuit pattern 41.

The housing 6 is a casing in which the semiconductor chip 2, the pressurizing member 1, and the substrate 4 are stored. An upper-side electrode 3 is provided on an upper side of the housing 6.

As shown in FIG. 10, the pressurizing member 1 is placed between the upper electrode 2a of the semiconductor chip 2 and the upper-side electrode 3 of the housing 6. The pressurizing member 1 electrically connects the upper electrode 2a and the upper-side electrode 3.

The pressurizing member 1 includes a plate spring member 11. As shown in FIG. 10, the plate spring member 11 includes two current paths 11a and 11b which are opposed to each other. Because of inclusion of the two current paths 11a and 11b, a current-carrying capacity of the plate spring member 11 can be increased.

In the semiconductor module according to the basic technique with the above-described configuration, when the semiconductor chip 2 is short-circuited due to malfunction or the like of the semiconductor chip 2, the plate spring member 11 may be disconnected. Disconnection of the plate spring member 11 may invite occurrence of arc discharge in a portion where disconnection takes place, so that the semiconductor module may be further damaged.

Disconnection of the plate spring member 11 takes place in the following manner. While the semiconductor chip 2 is being short-circuited, short-circuit currents flow through the two opposed current paths 11a and 11b in the same direction. Whereas currents flow through the two current paths 11a and 11b in the same direction also under normal operating conditions of the semiconductor chip 2, an amount of currents flowing under normal operating conditions is relatively small and no problem is caused. An amount of short-circuit currents is much larger than an amount of currents under normal operating conditions, so that an electromagnetic force (a force of attraction indicated by arrows A1 in FIG. 10) is generated between the opposed current paths 11a and 11b. Due to the force of attraction, the plate spring member 11 is damaged and the current paths 11a and 11b are broken, so that arc discharge occurs.

In the basic technique, it is necessary to design the housing 6 of the semiconductor module with consideration given to resistance to arc discharge, on the assumption that arc discharge occurs. Hence, a size and a weight of the housing 6 are increased, which causes problems of an increased size and an increased weight of the semiconductor module and of an increased manufacturing cost. Also, it is necessary to limit a tolerable current-amount of the semiconductor module, and add a short-circuit protection circuit, for example. Each of embodiments which will be described below is designated to solve the foregoing problems.

First Embodiment

<Configuration>

Figure 1:
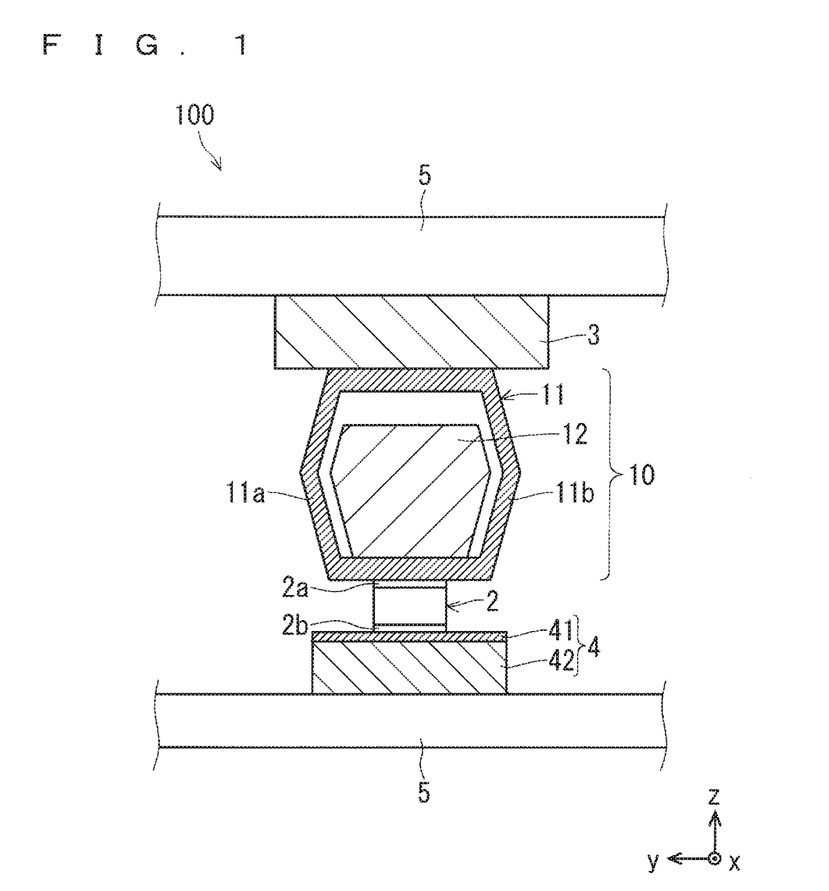
FIG. 1 is a side view of an inside of a housing of a semiconductor module according to a first embodiment.

FIG. 1 is a side view of an inside of a housing of a semiconductor module 100 according to a first embodiment. As shown in FIG. 1, the semiconductor module 100 according to the first embodiment includes a semiconductor chip 2, a housing 5, and a pressurizing member 10. The semiconductor chip 2 and the pressurizing member 10 are stored in the housing 5.

It is noted that the semiconductor chip 2 is an IGBT, for example. The semiconductor chip 2 includes an upper electrode 2a and a lower electrode 2b which serve as main electrodes and are placed in an upper surface and a lower surface of the semiconductor chip 2, respectively. Also, in a case where the semiconductor chip 2 is a switching element, the semiconductor chip 2 further includes a control electrode not shown in the drawings. The semiconductor chip 2 is mounted onto a substrate 4 in which a circuit pattern 41 is donned in a surface of an insulating substrate 42. The lower electrode 2b of the semiconductor chip 2 is joined to the circuit pattern 41.

The housing 5 is a casing in which the semiconductor chip 2, the pressurizing member 10, and the substrate 4 are stored. An upper-side electrode 3 is provided on an upper side of the housing 5.

The pressurizing member 10 is elastic in a direction (−z direction) in which the upper electrode 2a of the semiconductor chip 2 is pressed. In other words, the pressurizing member 10 stretches and contracts in ±z directions. In the first embodiment, elasticity of the pressurizing member 10 is implemented by elasticity of a plate spring member 11 which has an annular shape.

As shown in FIG. 1, the pressurizing member 10 is placed between the upper electrode 2a of the semiconductor chip 2 and the upper-side electrode 3 of the housing 5. The pressurizing member 10 electrically connects the upper electrode 2a and the upper-side electrode 3.

The pressurizing member 10 includes a conductive block 12 and the plate spring member 11. As shown in FIG. 1, the plate spring member 11 has an annular shape. The annular plate spring member 11 is shaped into a hexagonal form, for example. It is noted that a term "annular" does not necessarily mean that the plate spring member 11 forms one continuous ring. The plate spring member 11 may be intermittently provided in a surface where the plate spring member 11 is in contact with the upper-side electrode 3 of the housing 5, for example.

An upper portion of the annular plate spring member 11 is in contact with the upper-side electrode 3 of the housing 5. A lower portion of the annular plate spring member 11 is in contact with the upper electrode 2a of the semiconductor chip 2. The annular plate spring member 11 includes two current paths 11a and 11b which are opposed to each other.

The conductive block 12 is a block made of metal, and is a copper block, for example. The conductive block 12 is placed between the two current paths 11a and 11b which are opposed to each other. The conductive block 12 is in contact with an inner wall of the plate spring member 11. In the first embodiment, the conductive block 12 is in contact with an inner wall of the annular plate spring member 11, the inner wall being located near the semiconductor chip 2.

<Operation>

Figure 2:
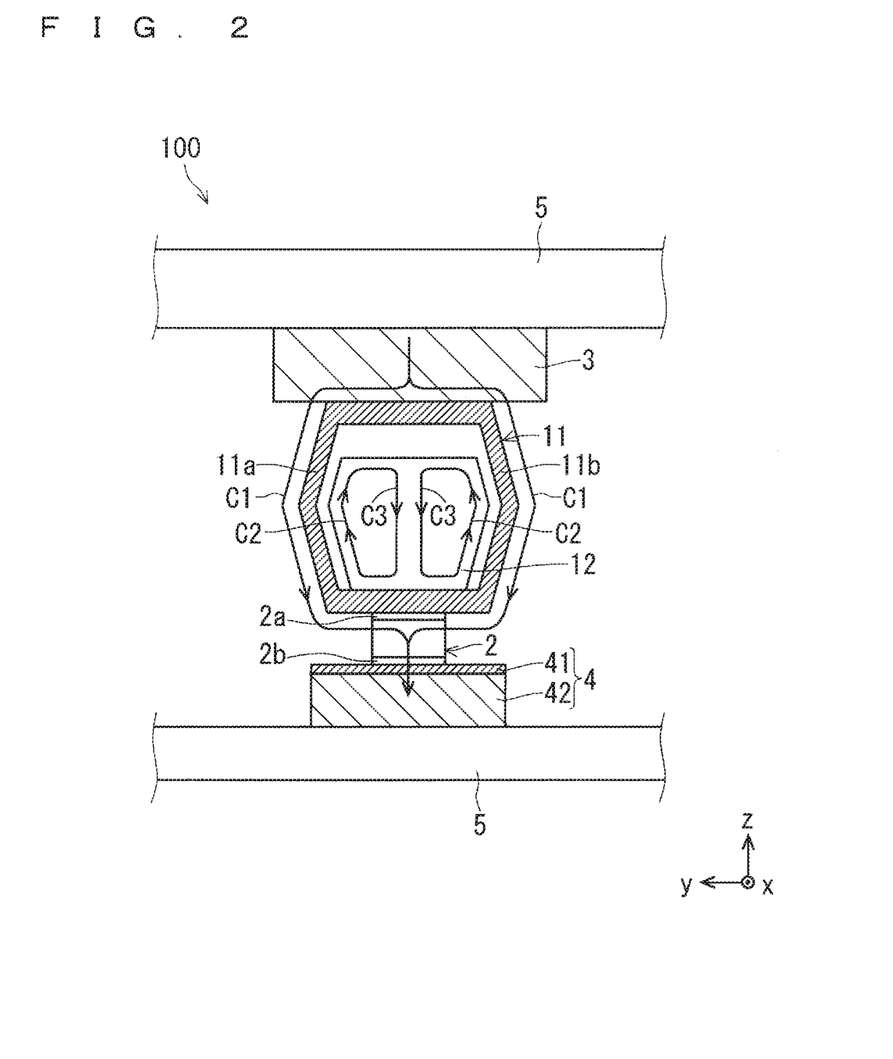
FIG. 2 is a schematic diagram showing a manner in which currents flow through a pressurizing member of the semiconductor module according to the first embodiment.

FIG. 2 is a schematic diagram showing a manner in which currents flow through the pressurizing member 10 of the semiconductor module 100 in the first embodiment.

As indicated by arrows C1 in FIG. 2, when the semiconductor chip 2 is short-circuited due to malfunction or the like of the semiconductor chip 2, short-circuit currents flow through the opposed current paths 11a and 11b of the plate spring member 11 in the −z direction. Thus, eddy currents are produced in a surface of the conductive block 12 due to a proximity effect. As indicated by arrows C2 in FIG. 2, in each of surfaces of the conductive block 12, the surfaces facing the current paths 11a and 11b, respectively (that is, surfaces being located in a y direction and a −y direction), currents which flow in a direction opposite to a short-circuit current (that is, the z direction) are produced. Then, currents indicated by arrows C2 are turned back by a surface of the conductive block 12, the surface being located in the z direction, and flow in the −z direction as indicated by arrows C3. Currents indicated by arrows C3 flow through surfaces of the conductive block 12, the surfaces not facing the current paths 11a and 11b (that is, surfaces being located in an x direction and a −x direction).

In this manner, since a current flows through the conductive block 12 in a direction opposite to a direction of a short-circuit current flowing through each of the current paths 11a and 11b of the plate spring member 11, a force of attraction generated between the two opposed current paths 11a and 11b in the plate spring member 11 is relieved. Accordingly, it is possible to suppress disconnection due to damage to the plate spring member 11.

Additionally, although a single semiconductor chip 2 and a single pressurizing member 10 are shown in FIG. 1, a plurality of semiconductor chips 2 and a plurality of pressurizing members 10 may be stored in a single housing 5. A configuration in which a plurality of semiconductor chips 2 and a plurality of pressurizing members 10 are stored in a single housing 5 will be described in a third embodiment.

<Effect>

The semiconductor module 100 according to the first embodiment includes at least one semiconductor chip 2, the housing 5 in which the semiconductor chip 2 is stored, and at least one pressurizing member 10 which is placed between the upper electrode 2a of the semiconductor chip 2 and the upper-side electrode 3 provided in the housing 5 and is configured to electrically connect the upper electrode 2a and the upper-side electrode 3, the pressurizing member 10 is elastic, and the pressurizing member 10 includes the conductive block 12 and the plate spring member 11 including the current paths 11a and 11b which are opposed to each other with at least a part of the conductive block 12 located between the current paths 11a and 11b.

In the semiconductor module 100 according to the first embodiment, the conductive block 12 is placed between the opposed current paths 11a and 11b of the plate spring member 11, and thus, when a short-circuit current flows through the current paths 11a and 11b, an eddy current flowing in a direction opposite to a short-circuit current is produced in the conductive block 12. As a result of this, a force of attraction generated between the opposed current paths 11a and 11b is relieved. Accordingly, it is possible to suppress disconnection due to damage to the plate spring member 11.

As described above, in the semiconductor module 100, damage to the plate spring member 11 can be suppressed, and thus, arc discharge can be suppressed from occurring due to a break in the current paths 11a and 11b. Accordingly, strength which is required of the housing 5 of the semiconductor module 100 is reduced, so that increase of a size and a weight of the semiconductor module 100 can be suppressed. Also, strength which is required of the housing 5 of the semiconductor module 100 is reduced, so that a manufacturing cost can also be reduced.

Further, in the semiconductor module 100 according to the first embodiment, the plate spring member 11 has an annular shape, the upper portion of the annular plate spring member 11 is in contact with the upper-side electrode 3 of the housing 5, the lower portion of the annular plate spring member 11 is in contact with the upper electrode 2a of the semiconductor chip 2, and the conductive block 12 is placed to be in contact with an inner wall of the annular plate spring member 11.

By placing the conductive block 12 such that the conductive block 12 is in contact with an inner wall of the annular plate spring member 11 as described above, it is possible to suppress disconnection due to damage to the plate spring member 11 when a short-circuit current flows through the plate spring member 11.

First Modification of First Embodiment

Figure 3:
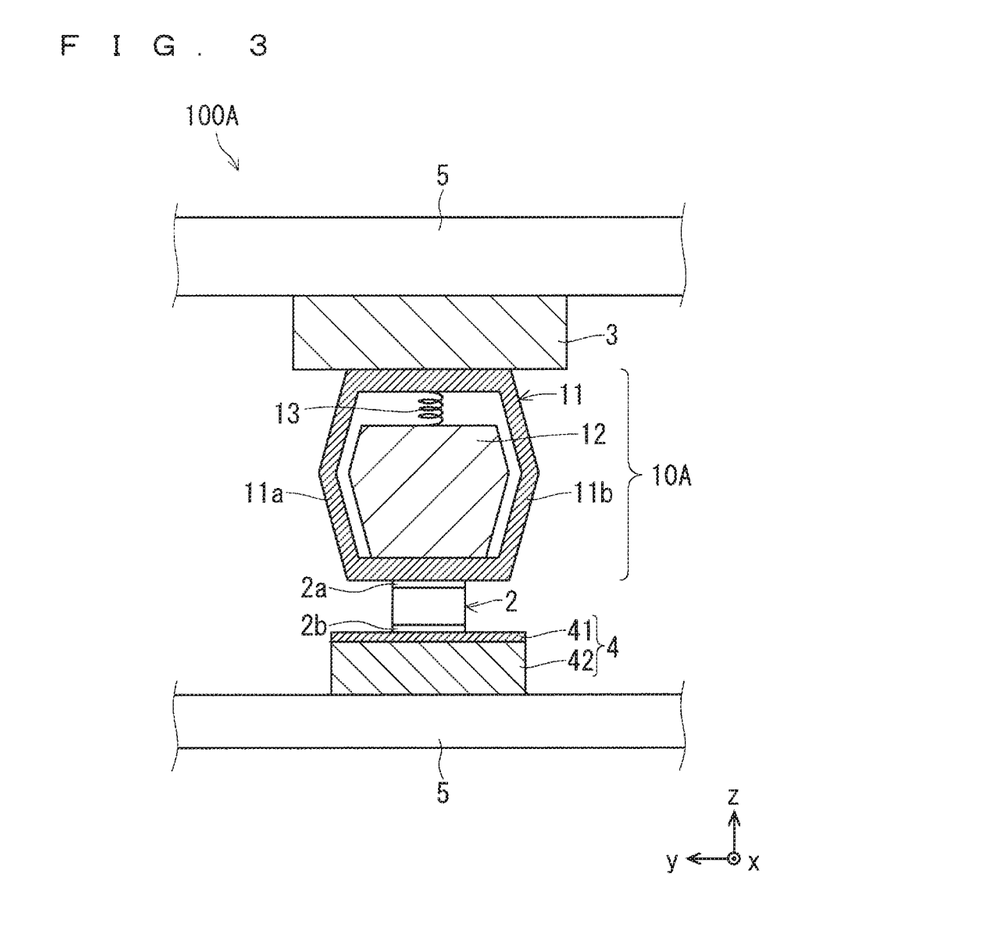
FIG. 3 is a side view of an inside of a housing of a semiconductor module according to a first modification of the first embodiment.

FIG. 3 is a side view of an inside of a housing of a semiconductor module 100A according to a first modification of the first embodiment. In the first modification, a pressurizing member 10A further includes a spring 13. The spring 13 is a coil spring, for example.

As shown in FIG. 3, in the first modification, the conductive block 12 and the spring 13 are placed in series with each other between an inner wall of the plate spring member 11, the inner wall being located near the semiconductor chip 2, and an inner wall of the plate spring member 11, the inner wall being located near the upper-side electrode 3 of the housing 5. In other words, the conductive block 12 and the spring 13 are placed to be stacked along the z direction.

Although the conductive block 12 is placed near the semiconductor chip 2 and the spring 13 is placed near the upper-side electrode 3 of the housing 5 in FIG. 3. respective positions of the conductive block 12 and the spring 13 may be interchanged.

In the first modification, by placing the spring 13 in series with the conductive block 12, it is possible to adjust elasticity of the pressurizing member 10A in accordance with a property of the spring 13. Even in a case where the spring 13 is conductive, the spring 13 functions as an inductance, and in particular, offers a high impedance at high frequencies, so that no current flows.

<Effect>

In the semiconductor module 100A according to the first modification of the first embodiment, the pressurizing member 10A further includes the spring 13, and the conductive block 12 and the spring 13 are placed in series with each other between an inner wall of the annular plate spring member 11, the inner wall being located near the semiconductor chip 2, and an inner wall of the plate spring member 11, the inner wall being located near the upper-side electrode 3 of the housing 5.

Thus, because of a configuration in which the pressurizing member 10A includes the spring 13, elasticity of the pressurizing member 10A can be adjusted in accordance with a property of the spring 13.

Second Modification of First Embodiment

Figure 4:
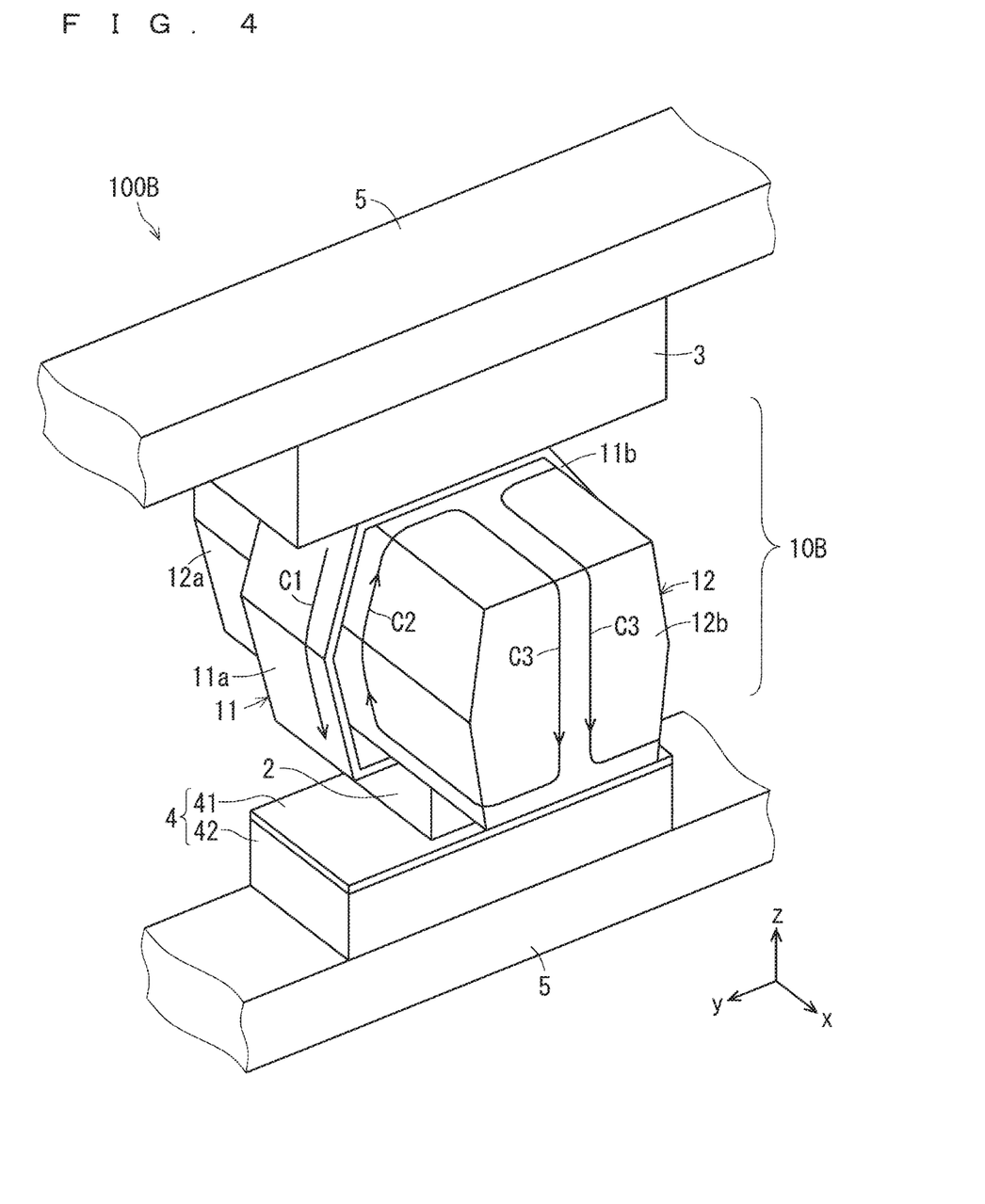
FIG. 4 is a perspective view of an inside of a housing of a semiconductor module according to a second modification of the first embodiment.

FIG. 4 is a perspective view of an inside of a housing of a semiconductor module 100B according to a second modification of the first embodiment. As shown in FIG. 4, in the second modification, the conductive block 12 included in a pressurizing member 10B includes protrusions 12a and 12b. The protrusions 12a and 12b of the conductive block 12 protrude in the ±x directions, respectively, from an annular opening of the plate spring member 11.

As shown in FIG. 4, eddy currents flowing through the conductive block 12 include a portion which flows in the same direction as a short-circuit current (arrow C1), as indicated by arrows C3. In this regard, currents indicated by arrows C3 flow through surfaces of the conductive block 12, the surfaces not facing the current paths 11a and 11b (that is, surfaces being located in the x direction and the −x direction). Then, in the second modification, surfaces of the conductive block 12, the surfaces being located in the x direction and the −x direction, are formed to protrude from the annular opening of the plate spring member 11. As a result of this, out of eddy currents produced in the conductive block 12, currents (currents indicated by arrows C3) flowing in the same direction as a short-circuit current can be kept away from a short-circuit current (a current indicated by arrow C1) flowing through the plate spring member 11.

<Effect>

In the semiconductor module 100B according to the second modification of the first embodiment, the conductive block 12 includes the protrusions 12a and 12b which protrude from the annular opening of the plate spring member 11.

As a result of this, out of eddy currents produced in the conductive block 12, a current which flows in the same direction as a short-circuit current flowing through the plate spring member 11, flows through the protrusions 12a and 12b. Accordingly, out of eddy currents produced in the conductive block 12, a current which flows in the same direction as a short-circuit current can be kept away from a short-circuit current flowing through the plate spring member 11. Consequently, a force of attraction generated between the two opposed current paths 11a and 11b of the plate spring member 11 is further relieved, so that disconnection due to damage to the plate spring member 11 can be suppressed.

Second Embodiment

<Configuration>

Figure 5:
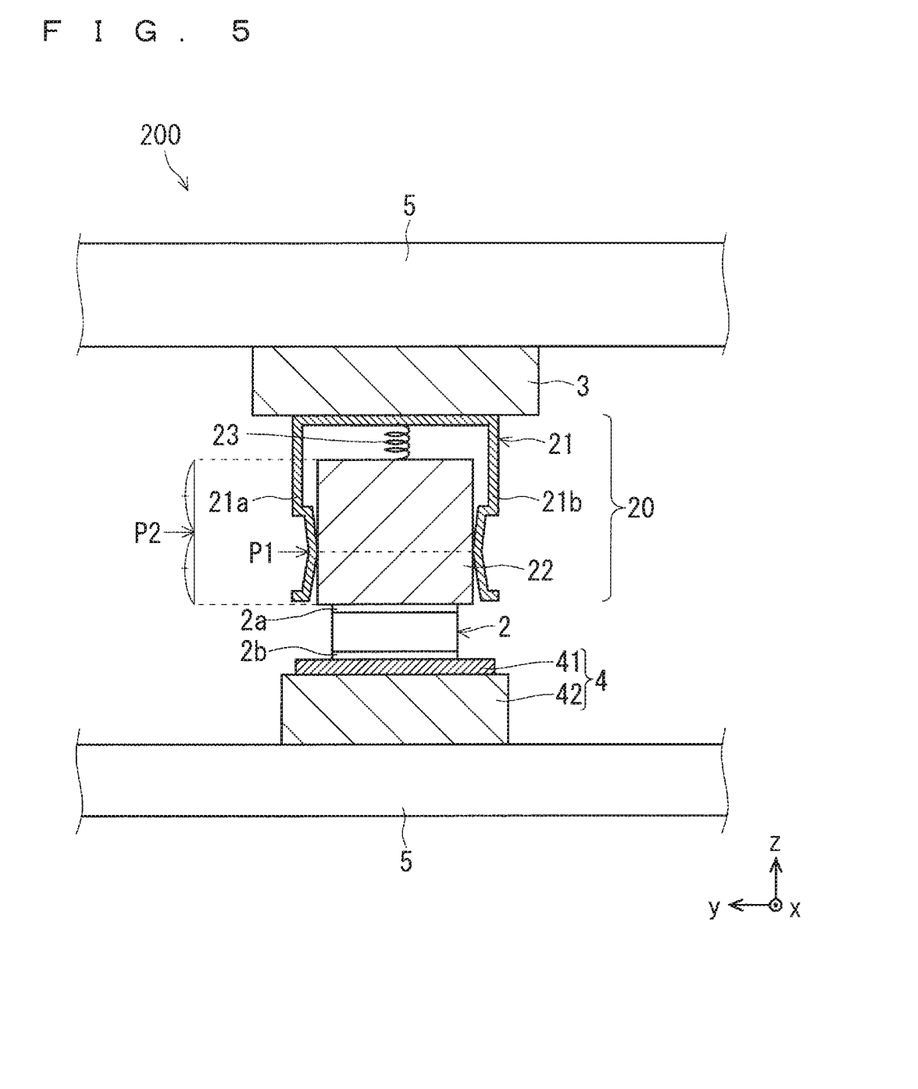
FIG. 5 is a side view of an inside of a housing of a semiconductor module according to a second embodiment.

FIG. 5 is a side view of an inside of a housing of a semiconductor module 200 according to a second embodiment. The semiconductor module 200 according to the second embodiment is different from that in the first embodiment (FIG. 1) in a configuration of a pressurizing member 20. Configurations of the other components are identical to those in the first embodiment, and thus description thereof is omitted.

The pressurizing member 20 is elastic in a direction (−z direction) in which an upper electrode 2a of a semiconductor chip 2 is pressed. In the second embodiment, elasticity of the pressurizing member 20 is implemented by elasticity of a spring 23.

As shown in FIG. 5, the pressurizing member 20 is placed between the upper electrode 2a of the semiconductor chip 2 and an upper-side electrode 3 of a housing 5. The pressurizing member 20 electrically connects the upper electrode 2a and the upper-side electrode 3.

The pressurizing member 20 includes a conductive block 22 and a plate spring member 21. As shown in FIG. 5, the plate spring member 21 has a U-shape. A bottom portion of the U-shaped plate spring member 21 is in contact with, or joined to, the upper-side electrode 3 of the housing 5. The U-shaped plate spring member 21 includes two current paths 21a and 21b which are opposed to each other.

The conductive block 22 is in contact with the U-shaped plate spring member 21 while being sandwiched between portions of the U-shaped plate spring member 21. In other words, at least a part of the conductive block 22 is placed between the two opposed current paths 21a and 21b. The U-shaped plate spring member 21 catches the conductive block 22 from both sides of the conductive block 22 while applying a pressure to the conductive block 22. Accordingly, even when the pressurizing member 20 stretches or contracts in ±z directions and the plate spring member 21 and the conductive block 22 slide relative to each other, the plate spring member 21 and the conductive block 22 are kept in contact with each other.

A surface of the conductive block 22, the surface being located near the semiconductor chip 2 (that is, a surface being located in the −z direction), is in contact with the upper electrode 2a of the semiconductor chip 2.

Also, the pressurizing member 20 includes the spring 23. The spring 23 is a coil spring, for example. As shown in FIG. 5, the spring 23 is placed between a surface of the conductive block 22, the surface being located near the upper-side electrode of the housing 5 (that is, a surface being located in the z direction) and an inner wall of a bottom portion of the U-shaped plate spring member 21. Additionally, even in a case where the spring 23 is conductive, the spring 23 functions as an inductance, and in particular, offers a high impedance at high frequencies, so that no current flows.

Also, a position P1 where the conductive block 22 is in contact with the plate spring member 21 while being sandwiched between portions of the plate spring member 21, is closer to the semiconductor chip 2 than a midpoint P2 in a height direction of the conductive block 22 is.

<Operation>

Figure 6:
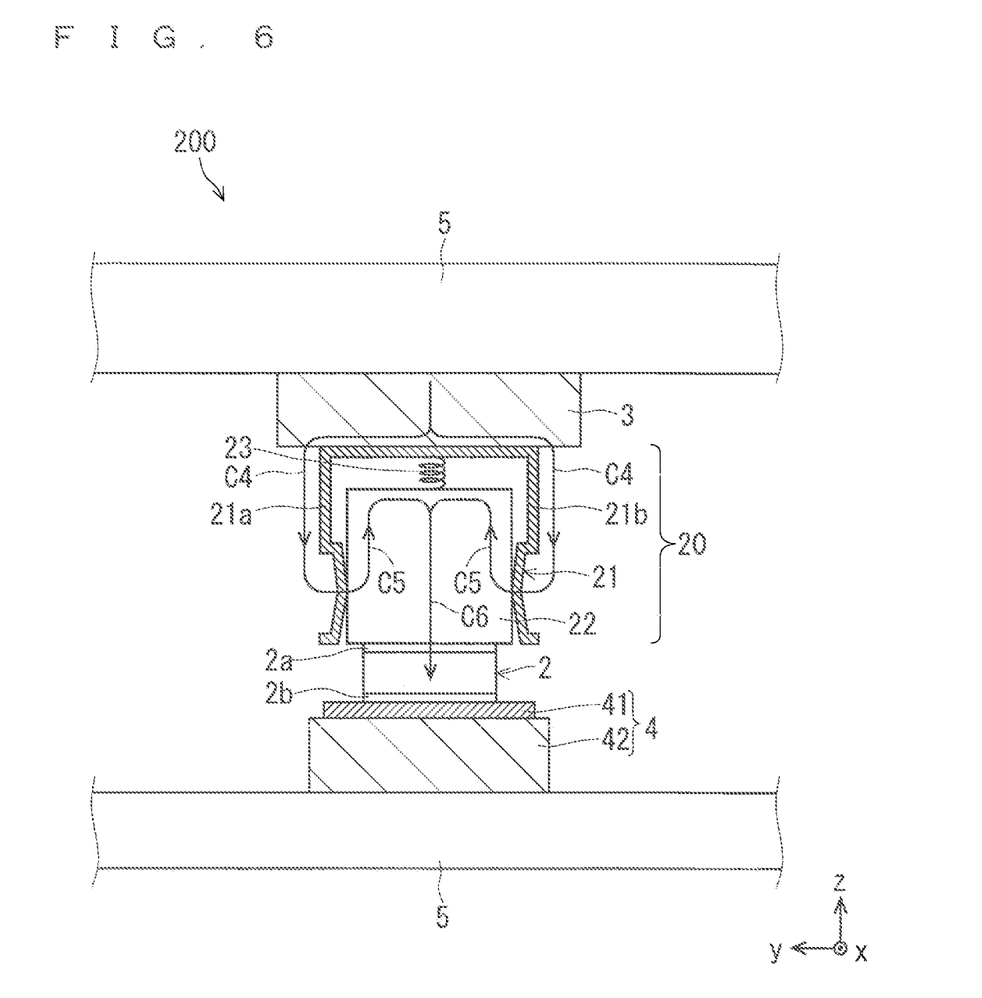
FIG. 6 is a schematic diagram showing a manner in which currents flow through a pressurizing member of the semiconductor module according to the second embodiment.

FIG. 6 is a schematic diagram showing a manner in which currents flow through the pressurizing member 20 of the semiconductor module 200 according to the second embodiment.

As indicated by arrows C4 in FIG. 6, when the semiconductor chip 2 is short-circuited due to malfunction or the like of the semiconductor chip 2, short-circuit currents flow through the opposed current paths 21a and 21b of the plate spring member 21 in the −z direction. Short-circuit currents flow into the conductive block 22 at a point where the plate spring member 21 and the conductive block 22 are in contact with each other. Currents, which flow into the conductive block 22, then flow through surfaces of the conductive block 22, the surfaces respectively facing the current paths 21a and 21b (that is, surfaces being located in a y direction and a −y direction), in the z direction as indicated by arrows C5. Thereafter, currents indicated by arrows C5 are turned back by a surface of the conductive block 22, the surface being located in the z direction, and flow in the −z direction as indicated by arrows C6. Currents indicated by arrows C6 flow through surfaces of the conductive block 22, the surfaces being not proximate to the current paths 21a and 21b (that is, surfaces being located in an x direction and a −x direction). It is noted that the reason for flow of currents in the z direction in the conductive block 22 as indicated by arrows C5 is to minimize energy of currents.

In this manner, since a current flows through the conductive block 22 in a direction opposite to a direction of a short-circuit current flowing through each of the current paths 21a and 21b of the plate spring member 21, a force of attraction generated between the two opposed current paths 21a and 21b in the plate spring member 21 is relieved. Accordingly, it is possible to suppress disconnection due to damage to the plate spring member 21.

<Effect>

In the semiconductor module according to the second embodiment, the plate spring member 21 has a U-shape, a bottom portion of the U-shaped plate spring member 21 is in contact with the upper-side electrode 3 of the housing 5, the conductive block 22 is in contact with the U-shaped plate spring member 21 while being sandwiched between portions of the U-shaped plate spring member 21, and a surface of the conductive block 22, the surface being located near the semiconductor chip 2, is in contact with the upper electrode 2a of the semiconductor chip 2.

By placing the conductive block 22 such that the conductive block 22 is sandwiched between portions of the U-shaped plate spring member 21 as described above, it is possible to suppress disconnection due to damage to the plate spring member 21 when a short-circuit current flows through the plate spring member 21.

Also, in the semiconductor module according to the second embodiment, the pressurizing member 20 further includes the spring 23 which is placed between a surface of the conductive block 22, the surface being located near the upper-side electrode 3 of the housing 5, and an inner wall of a bottom portion of the U-shaped plate spring member 21. Thus, because of a configuration in which the pressurizing member 20 includes the spring 23, the pressurizing member 20 is allowed to have elasticity.

Also, in the semiconductor module according to the second embodiment, the position P1 where the conductive block 22 is in contact with the U-shaped plate spring member 21 while being sandwiched between portions of the U-shaped plate spring member 21 is closer to the semiconductor chip 2 than the midpoint P2 in the height direction of the conductive block 22 is.

Accordingly, the plate spring member 21 and the conductive block 22 are in contact with each other in a position which is closer to the semiconductor chip 2 than the midpoint P2 in the height direction of the conductive block 22 is, so that a portion of the conductive block 22, the portion facing each of the current paths 21a and 21b of the plate spring member 21, can be made longer. Hence, a force of attraction generated between the current paths 21a and 21b of the plate spring member 21 can be further relieved.

First Modification of Second Embodiment

Figure 7:
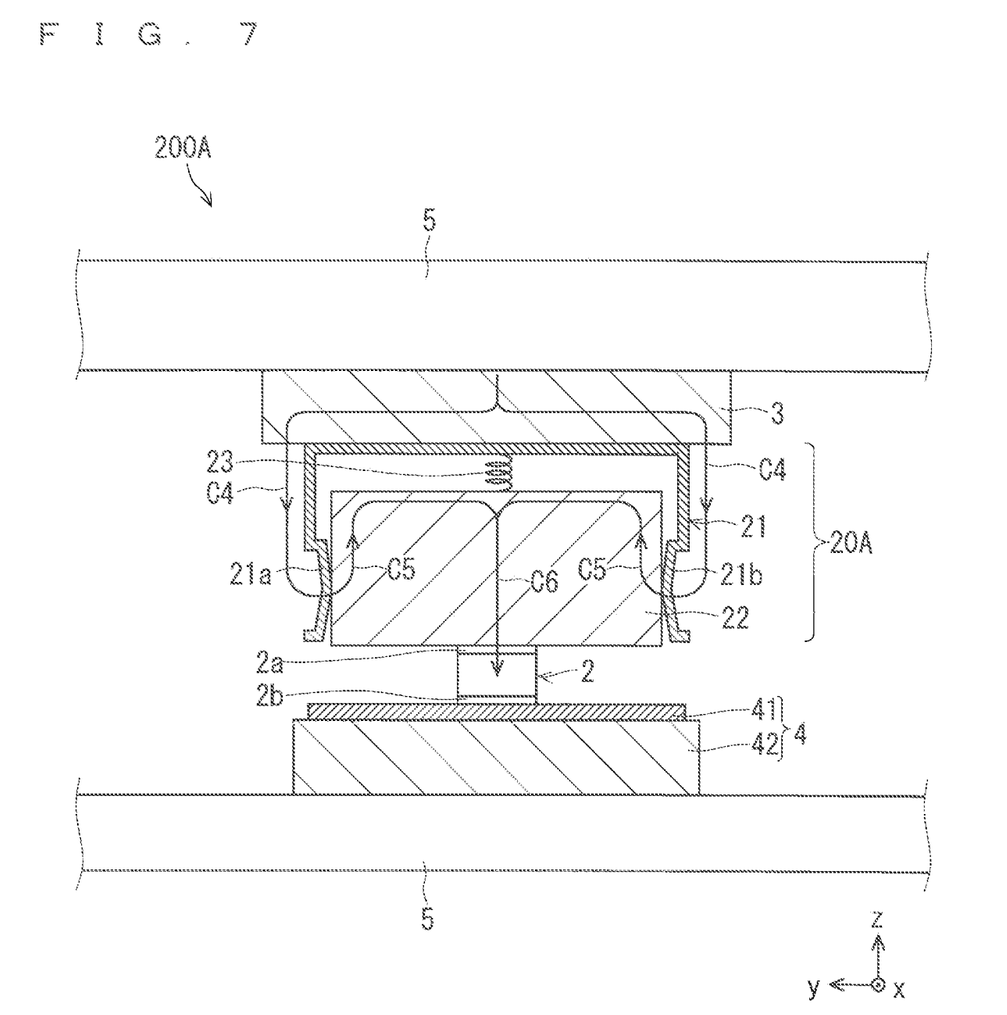
FIG. 7 is a side view of an inside of a housing of a semiconductor module according to a first modification of the second embodiment.

FIG. 7 is a side view of an inside of a housing of a semiconductor module 200A according to a first modification of the second embodiment. As shown in FIG. 7, in the first modification, the conductive block 22 included in a pressurizing member 20A has a shape which is horizontally elongated. In other words, a width of the conductive block 22 along a direction along which the conductive block 22 is sandwiched between portions of the U-shaped plate spring member 21 (that is, the y direction) is greater than a height of the conductive block 22.

Also, in the first modification, as the conductive block 22 has a shape which is horizontally elongated, the plate spring member 21 also has a shape which is horizontally elongated.

As shown in FIG. 7, currents flowing through the conductive block 22 include a portion which flows in the same direction as a short-circuit current (arrows C4), as indicated by arrow C6. In this regard, a current indicated by arrow C6 flows through a surface of the conductive block 22, the surface not facing each of the current paths 21a and 21b (that is, surfaces being located in the x direction and the −x direction). Then, in the first modification, each of surfaces of the conductive block 22, the surfaces being located in the x direction and the −x direction, is formed into a shape which is horizontally elongated. As a result of this, a current (a current indicated by arrow C6) flowing through the conductive block 22 in the same direction as a short-circuit current can be kept away from a short-circuit current (a current indicated by arrows C4) flowing through the plate spring member 21.

<Effect>

In the semiconductor module 200A according to the first modification of the second embodiment, a width of the conductive block 22 along a direction along which the conductive block 22 is sandwiched between portions of the U-shaped plate spring member 21 is greater than a height of the conductive block 22.

By designing such that a width of the conductive block 22 along a direction along which the conductive block 22 is sandwiched between portions of the U-shaped plate spring member 21 is greater than a height of the conductive block 22, it is possible to keep a current flowing through the conductive block 22 in the same direction as a short-circuit current, away from a short-circuit current flowing through the plate spring member 21. Accordingly, a force of attraction generated between the two opposed current paths 21a and 21b of the plate spring member 21 is further relieved. Consequently, it is possible to suppress disconnection due to damage to the plate spring member 21.

Second Modification of Second Embodiment

Figure 8:
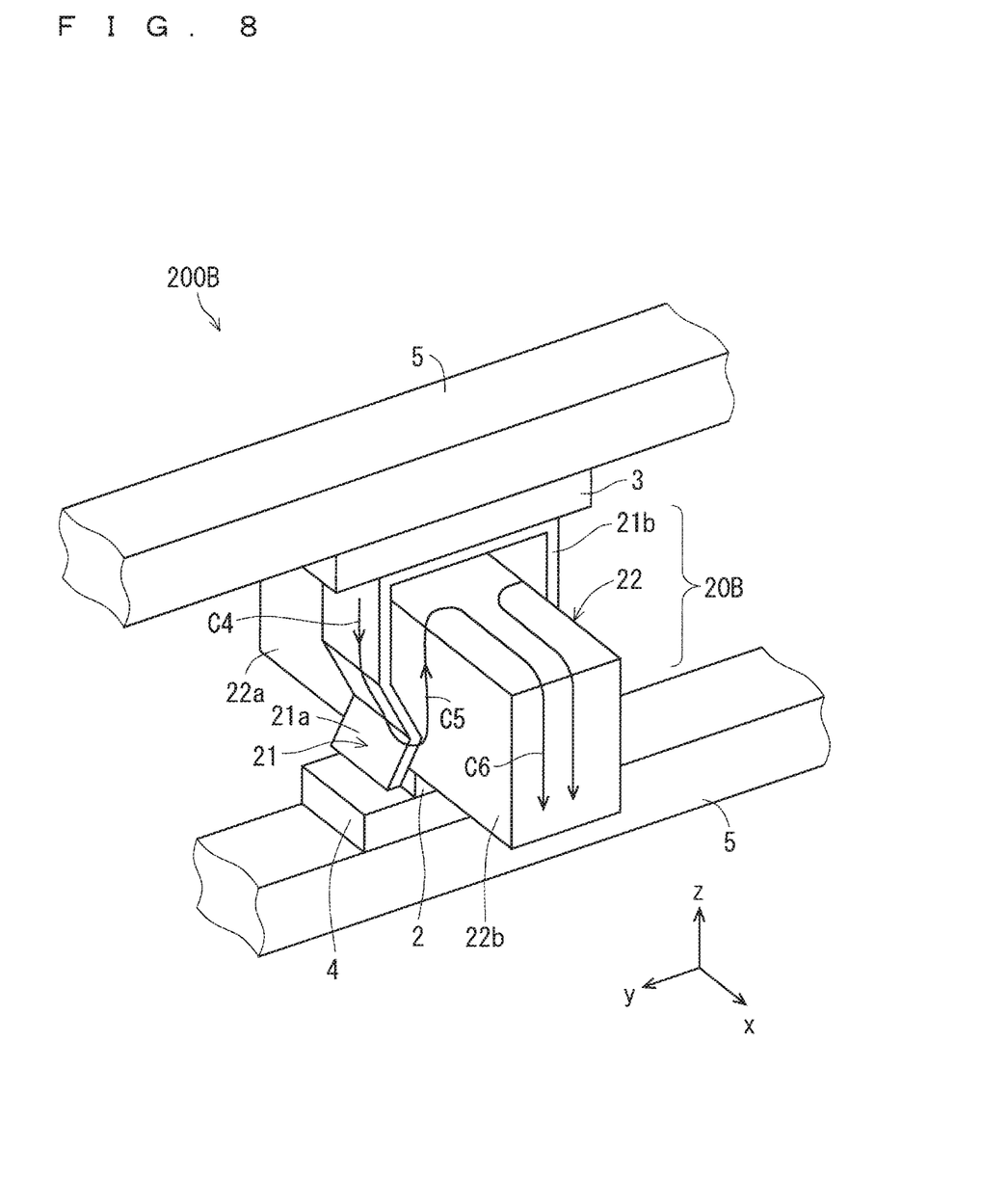
FIG. 8 is a perspective view of an inside of a housing of a semiconductor module according to a second modification of the second embodiment.

FIG. 8 is a perspective view of an inside of a housing of a semiconductor module 200B according to a second modification of the second embodiment.

As shown in FIG. 8, in the second modification, the conductive block 22 included in a pressurizing member 20B includes protrusions 22a and 22b.

Because of inclusion of the protrusions 22a and 22b in the conductive block 22, a width of a surface of the conductive block 22, the surface being in contact with the plate spring member 21 (that is, surfaces being located in the y direction and the −y direction), is greater than a width of each of the current paths 21a and 21b of the plate spring member 21. In other words, the protrusions 22a and 22b of the conductive block 22 protrude from the plate spring member 21 in the ±x directions, respectively.

As shown in FIG. 8, currents flowing through the conductive block 22 include a portion which flows in the same direction as a short-circuit current (arrow C4) flowing through the plate spring member 21, as indicated by arrows C6. In this regard, currents indicated by arrows C6 flow through surfaces of the conductive block 22, the surfaces not facing the current paths 21a and 21b (that is, surfaces being located in the x direction and the −x direction). Then, in the second modification, surfaces of the conductive block 22, the surfaces being located in the x direction and the −x direction, are formed to protrude from the plate spring member 21. As a result of this, out of currents flowing through the conductive block 22, currents (currents indicated by arrows C6) flowing in the same direction as a short-circuit current, can be kept away from a short-circuit current (a current indicated by arrow C4) flowing through the plate spring member 21.

<Effect>

In the semiconductor module 200B according to the second modification of the second embodiment, a width of a surface of the conductive block 22, the surface being in contact with the U-shaped plate spring member 21, is greater than a width of each of the current paths 21a and 21b of the plate spring member 21.

By designing such that a width of a surface of the conductive block 22, the surface being in contact with the plate spring member 21, is greater than a width of each of the current paths 21a and 21b of the plate spring member 21, it is possible to keep a current flowing through the conductive block 22 in the same direction as a short-circuit current, away from a short-circuit current flowing through the plate spring member 21. Accordingly, a force of attraction generated between the two opposed current paths 21a and 21b of the plate spring member 21 is further relieved. Consequently, disconnection due to damage to the plate spring member 21 can be further suppressed.

It is noted that the conductive block 22 may be formed into a shape which has both of a feature of the first modification (FIG. 7) and a feature of the second modification (FIG. 8). More specifically, the conductive block 22 may be configured in such a manner that a width of the conductive block 22 along a direction along which the conductive block 22 is sandwiched between portions of the U-shaped plate spring member 21 is greater than a height of the conductive block 22, and a width of a surface of the conductive block 22, the surface being in contact with the U-shaped plate spring member 21, is greater than a width of each of the current paths 21a and 21b of the plate spring member 21.

In the second embodiment, by combination of the first and second modifications, out of currents flowing through the conductive block 22, currents (currents indicated by arrows C6 in FIGS. 7 and 8) flowing through in the same direction as a short-circuit current can be kept further away from a short-circuit current (a current indicated by arrows C4 in FIGS. 7 and 8) flowing through the plate spring member 21. Accordingly, a force of attraction generated between the two opposed current paths 21a and 21b of the plate spring member 21 is further relieved. Consequently, it is possible to more reliably suppress disconnection due to damage to the plate spring member 21.

Third Embodiment

Figure 9:
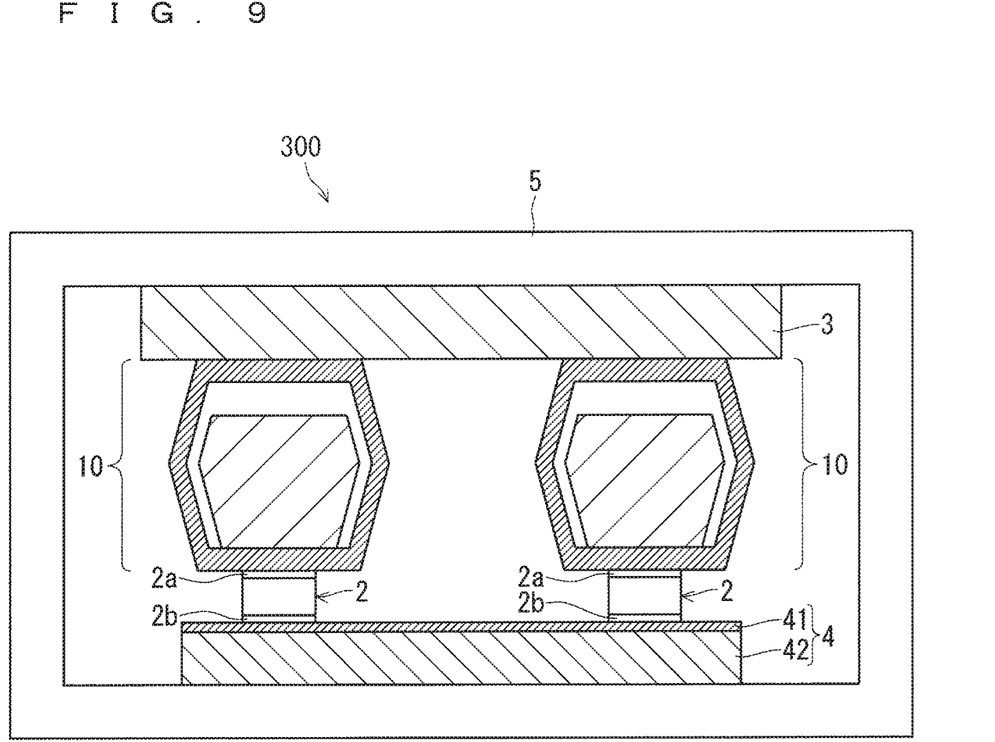
FIG. 9 is a side view of an inside of a housing of a semiconductor module according to a third embodiment.

FIG. 9 is a side view of an inside of a housing of a semiconductor module 300 according to a third embodiment. As shown in FIG. 9, in the semiconductor module 300, a plurality of semiconductor chips 2 and a plurality of pressurizing members 10 are stored in a housing 5.

In the third embodiment, each of the pressurizing members 10 is placed for each of the semiconductor chips 2. A configuration of each of the pressurizing members 10 is identical to that in the first embodiment (FIG. 1), and thus description thereof is omitted. In the third embodiment, the plurality of semiconductor chips 2 are placed between a common upper-side electrode 3 and a circuit pattern 41. The plurality of semiconductor chips 2 are an IGBT and a freewheeling diode connected in parallel to the IGBT, for example.

It is noted that in the third embodiment, the pressurizing member 10 may be replaced with any of the pressurizing members 10A, 10B, 20, 20A, and 20B.

<Effect>

In the semiconductor module 300 according to the third embodiment, the plurality of semiconductor chips 2 and the plurality of pressurizing members 10 are included, each of the pressurizing members 10 is placed for each of the plurality of semiconductor chips 2, and the plurality of semiconductor chips 2 and the plurality of pressurizing members 10 are stored in the same housing 5.

In a case where the plurality of semiconductor chips 2 are placed in the housing 5, by placing each of the pressurizing members 10 for each of the plurality of semiconductor chips, it is possible to uniformly apply pressures to the plurality of semiconductor chips 2. Further, as described in the first and second embodiments, also in the semiconductor module 300, damage to the plate spring member 11 can be suppressed, so that occurrence of arc discharge is suppressed. Accordingly, strength which is required of the housing 5 of the semiconductor module 300 is reduced, so that increase of a size and a weight of the semiconductor module 300 can be suppressed. Further, strength which is required of the housing 5 of the semiconductor module 300 is reduced, so that also a manufacturing cost can be reduced.

Additionally, in the semiconductor module according to each of the first to third embodiments, the semiconductor chip 2 may include a wide-band-gap semiconductor. Also, a wide-band-gap semiconductor may include silicon carbide (SiC). Further, in the semiconductor module according to each of the first to third embodiments, the semiconductor chip 2 may be an IGBT. On the other hand, the semiconductor chip may be a metal-oxide-semiconductor field-effect transistor (MOSFET).

To use a wide-band-gap semiconductor for the semiconductor chip 2 raises a temperature at which a semiconductor module can operate. To use an IGBT as the semiconductor chip 2 achieves high-power high-speed switching. Further, in a MOSFET made of SiC, a high rated voltage (high withstand voltage), an operation at high frequencies, and reduction of switching loss can be achieved.

While the present invention has been shown and described in detail, the foregoing description is in all aspects illustrative and the present invention is not limited to the foregoing description. It is therefore understood that non-described numerous modifications and variations can be devised without departing from the scope of the present invention.

EXPLANATION OF REFERENCE SIGNS 1, 10, 10A, 10B, 20, 20A, 20B: pressurizing member
2: semiconductor chip
2a: upper electrode
2b: lower electrode
3: upper-side electrode
4: substrate
41: circuit pattern
42: insulating substrate
5, 6: housing
11, 21: plate spring member
11a, 11b, 21a, 21b: current path
12, 22: conductive block
12a, 12b, 22a, 22b: protrusion
100, 100A, 100B, 200, 200A, 200B, 300: semiconductor module

The invention claimed is:
1. A semiconductor module comprising:
at least one semiconductor chip;
a housing in which the semiconductor chip is stored; and
at least one pressurizing member being placed between an upper electrode of the semiconductor chip and an upper-side electrode provided in the housing, the pressurizing member being configured to electrically connect the upper electrode and the upper-side electrode, wherein
the pressurizing member is elastic,
the pressurizing member includes:
    a conductive block; and
    a plate spring member including current paths that are opposed to each other with at least a part of the conductive block located between the current paths,
the plate spring member has an annular shape,
an upper portion of the annular plate spring member is in contact with the upper-side electrode of the housing, a lower portion of the annular plate spring member is in contact with the upper electrode of the semiconductor chip, and the conductive block is placed to be in contact with an inner wall of the annular plate spring member.

2. The semiconductor module according to claim 1, wherein the pressurizing member further includes a spring, and the conductive block and the spring are placed in series with each other between a first inner wall of the annular plate spring member that is located near the semiconductor chip, and a second inner wall of the annular plate spring member that is located near the upper-side electrode of the housing.

3. The semiconductor module according to claim 1, wherein the conductive block includes a protrusion that protrudes from an annular opening of the plate spring member.

4. A semiconductor module comprising:

at least one semiconductor chip;

a housing in which the semiconductor chip is stored; and at least one pressurizing member being placed between an upper electrode of the semiconductor chip and an upper-side electrode provided in the housing, the pressurizing member being configured to electrically connect the upper electrode and the upper-side electrode, wherein the pressurizing member is elastic, the pressurizing member includes:
   a conductive block; and
   a plate spring member including current paths that are opposed to each other with at least a part of the conductive block located between the current paths, the plate spring member has a U-shape, a bottom portion of the U-shaped plate spring member is in contact with the upper-side electrode of the housing, the conductive block is in contact with the U-shaped plate spring member while being sandwiched between portions of the U-shaped plate spring member, and a surface of the conductive block, the surface being located near the semiconductor chip, is in contact with the upper electrode of the semiconductor chip.

5. The semiconductor module according to claim 4, wherein the pressurizing member further includes a spring that is placed between a surface of the conductive block, the surface being located near the upper-side electrode of the housing, and an inner wall of the bottom portion of the U-shaped plate spring member.

6. The semiconductor module according to claim 4, wherein a position where the conductive block is in contact with the U-shaped plate spring member while being sandwiched between the portions of the U-shaped plate spring member, is closer to the semiconductor chip than a midpoint in a height direction of the conductive block is.

7. The semiconductor module according to claim 4, wherein a width of the conductive block along a direction along which the conductive block is sandwiched between the portions of the U-shaped plate spring member is greater than a height of the conductive block.

8. The semiconductor module according to claim 4, wherein a width of a surface of the conductive block, the surface being in contact with the U-shaped plate spring member, is greater than a width of each of the current paths of the plate spring member.

9. The semiconductor module according to claim 4, wherein a width of the conductive block along a direction along which the conductive block is sandwiched between the portions of the U-shaped plate spring member is greater than a height of the conductive block, and a width of a surface of the conductive block, the surface being in contact with the U-shaped plate spring member, is greater than a width of a portion of the plate spring member, the portion being in contact with the conductive block.

10. The semiconductor module according to claim 1, wherein the at least one semiconductor chip comprises a plurality of semiconductor chips, the at least one pressurizing member comprises a plurality of pressurizing members, each of the pressurizing members is placed for each of the plurality of semiconductor chips, and the plurality of semiconductor chips and the plurality of pressurizing members are stored in the same housing.

11. The semiconductor module according to claim 1, wherein the at least one semiconductor chip includes a wide-band-gap semiconductor.

12. The semiconductor module according to claim 11, wherein the wide-band-gap semiconductor includes silicon carbide.

13. The semiconductor module according to claim 1, wherein the at least one semiconductor chip is an IGBT.

14. The semiconductor module according to claim 1, wherein the at least one semiconductor chip is a MOSFET.

* * * * *